(12) United States Patent
Koops et al.

(10) Patent No.: US 7,786,403 B2
(45) Date of Patent: Aug. 31, 2010

(54) METHOD FOR HIGH-RESOLUTION PROCESSING OF THIN LAYERS USING ELECTRON BEAMS

(75) Inventors: Hans Koops, Ober-Ramstadt (DE); Klaus Edinger, Heppenheim (DE); Sergey Babin, Castro Valley, CA (US); Thorsten Hofmann, Rodgau (DE); Petra Spies, Mainz (DE)

(73) Assignee: Nawo Tec GmbH, Rossdorf (DE)

( * ) Notice: Subject to any disclaimer, the term of this patent is extended or adjusted under 35 U.S.C. 154(b) by 1243 days.

(21) Appl. No.: 10/927,956

(22) Filed: Aug. 27, 2004

(65) Prior Publication Data

US 2005/0087514 A1 Apr. 28, 2005

Related U.S. Application Data

(60) Provisional application No. 60/498,677, filed on Aug. 28, 2003.

(51) Int. Cl.
*B23K 15/00* (2006.01)
*H01L 21/302* (2006.01)
*H01L 21/461* (2006.01)
(52) U.S. Cl. ........................ 219/121.2; 438/795; 216/63
(58) Field of Classification Search ...............................
219/121.19–121.23, 121.33; 216/63; 438/795; 250/492.2, 492.3; 156/345.4
See application file for complete search history.

(56) References Cited

U.S. PATENT DOCUMENTS 4,239,954 A 12/1980 Howard et al.

5,073,175 A * 12/1991 Anand et al. ............... 95/51

(Continued)

FOREIGN PATENT DOCUMENTS

DE 3042650 5/1981

(Continued)

OTHER PUBLICATIONS

Wang et al., "Etching Characteristics of Chromium Thin Films by Electron Beam Induced Surface Reaction," Semiconductor Science and Technology. 18, 2003, (pp. 199-205).

(Continued)

*Primary Examiner*—Samuel M Heinrich
(74) *Attorney, Agent, or Firm*—Meyertons, Hood, Kivlin, Kowert & Goetzel, P.C.; Eric B. Meyertons

(57) ABSTRACT

A method for etching a chromium layer in a vacuum chamber which may comprise introducing a halogen compound into the vacuum chamber, directing an electron beam onto the area of the chromium layer to be etched and/or introducing an oxygen including compound into the vacuum chamber. A further method for the highly resolved removal of a layer out of metal and/or metal oxide which may be arranged on an isolator or a substrate having poor thermal conductivity, may comprise arranging the layer inside a vacuum chamber, bombarding the layer with a focused electron beam with an energy of 3-30 keV, wherein the electron beam may be guided such that the energy transfer per time and area causes a localized heating of the layer above its melting and/or vaporization point and wherein the removal of the layer may be performed without the supply of reaction gases into the vacuum chamber.

14 Claims, 2 Drawing Sheets

U.S. PATENT DOCUMENTS

| | | | | |
|---|---|---|---|---|
| 5,508,368 | A | * | 4/1996 | Knapp et al. ................. 427/534 |
| 5,879,827 | A | * | 3/1999 | Debe et al. .................... 429/40 |
| 6,042,738 | A | * | 3/2000 | Casey et al. .................... 430/5 |
| 6,105,589 | A | * | 8/2000 | Vane ........................... 134/1.1 |
| 6,177,147 | B1 | * | 1/2001 | Samukawa et al. .......... 427/569 |
| 6,353,219 | B1 | | 3/2002 | Kley |
| 6,534,141 | B1 | * | 3/2003 | Hull et al. ................... 428/36.9 |
| 6,753,538 | B2 | * | 6/2004 | Musil et al. ............... 250/492.2 |
| 7,323,399 | B2 | * | 1/2008 | Demos et al. ............... 438/487 |
| 2003/0000921 | A1 | * | 1/2003 | Liang et al. ................... 216/59 |
| 2003/0047691 | A1 | | 3/2003 | Musil et al. |
| 2003/0064323 | A1 | * | 4/2003 | Sato et al. ................... 430/313 |
| 2003/0215722 | A1 | | 11/2003 | Kanamitsu et al. |
| 2005/0045821 | A1 | * | 3/2005 | Noji et al. ................... 250/311 |
| 2005/0287824 | A1 | * | 12/2005 | Shapoval et al. ............ 438/795 |

FOREIGN PATENT DOCUMENTS

| | | |
|---|---|---|
| DE | 10261035 | 12/2002 |
| EP | 1051536 | 7/2003 |
| JP | 58022382 | 2/1983 |
| JP | 07011429 | 1/1995 |
| JP | 2003195481 | 7/2003 |

OTHER PUBLICATIONS

Utke et al., "Focused-Electron-Beam-Induced Deposition of Freestanding Three-Dimensional Nanostructures of Pure Coalesced Copper Crystals," Applied Physics Letters, vol. 81, No. 17, Oct. 21, 2002, (pp. 3245-3247).

Hawkes et al., "The Preparation of Microcircuit Stencils and Patterns by Photomechanics and Electron Beam Machining," Microelectronics and Reliability, vol. 4, 1965, (pp. 65-79).

PCT Application No. PCT/EP2004/009049 International Search Report dated May 6, 2005, (6 Pages).

* cited by examiner

METHOD FOR HIGH-RESOLUTION PROCESSING OF THIN LAYERS USING ELECTRON BEAMS

PRIORITY CLAIM

This application claims benefit of priority of provisional application Ser. No. 60/498,677 titled "METHOD FOR HIGH-RESOLUTION PROCESSING OF THIN LAYERS WITH ELECTRON BEAMS" filed on Aug. 28, 2003, whose inventors Dr. Hans Koops, Dr. Klaus Edinger, Dr. Sergey Babin, Thorsten Hofmann, and Petra SpieB.

BACKGROUND

1. Field of the Invention

The present invention relates to methods for high resolution processing of thin layers using electron beams, in particular layers in a mask for photolithography or in a semiconductor device.

2. Description of the Related Art

Semiconductor devices, such as processors or memory chips, can be produced using photolithography. A photoresist layer on a wafer of a semiconductor material can be exposed to light through a mask which creates a pattern for microscopically fine structures. The wafer of semiconductor material can be subjected to further method steps to manufacture electronic components of the device (e.g., transistors, capacitors etc.). In order to achieve higher densities of integration within a semiconductor device, ultraviolet light (e.g., light with short wavelengths) can be used to expose the photoresist layer on the wafer of a semiconductor material to light through the mask. Manufacturing suitable masks for this lithography method can be expensive.

If it is found that a mask comprises an error, it is desirable to repair the mask. To this end, it may be necessary to selectively remove or deposit metal layers on the mask. For example, chromium layers can be deposited on the mask which can form the opaque sections of the mask, with a high spatial resolution. A similar problem arises if an already finished semiconductor device is to be modified (so-called "circuit editing") wherein the structure of the strip conductors of the device is modified with high resolution. The metal layers to be processed are typically arranged within a composite of a metal/metal oxide/insulator.

One method known from the prior art is the processing using a focused ion beam. However, this causes inevitably the implantation of ions in the substrate, for example the quartz substrate of a mask for photolithography, which thereby changes the properties of the wafer. This disadvantage of the ion beam technology is avoided if electron beams are used. More information can be found on this in: T. Liang, et al., "Progress in extreme ultraviolet mask repair using a focused ion beam", J. Vac. Sci. Technol. B 18(6), 3216 (2000), and T. Liang, et al., "Evaluation of 157 nm substrate damage during mask repair", 157 nm Lithography Symposium, Dana Point, Calif., May 2001.

In general it is also known to process metals using electron beams of high energy, for example for welding. However, if the diameter of the area covered by the electron beam is less than two micrometers (2 μ), the area heated by the electron beam is significantly greater than the area of the beam supplying the heat. As a consequence, it was considered to be impossible, until now, to process a wafer of a semiconductor material with electron beams having a resolution necessary for the tasks mentioned above.

Also known in the art is a different method called electron beam induced etching (EBIE). It is known that $XeF_2$ can be used as a spontaneous and activatable etching means for the electron beam induced etching of metals and metal oxides, here silicon. For more information please review: J. W. Coburn and H. F. Winters, "Ion- and electron-assisted gas-surface chemistry—an important effect in plasma etching", J. Appl. Phys. Vol. 50(5), 3189 (1979). The electron beam selectively breaks up the molecules of the etching gas and thereby allows a spatially resolved etching. For example the article "Etching characteristics of chromium thin films by an electron beam induced surface reaction" of P. E. Russel et al. (Semicond. Sci. Technol. 18 (2003) page 199-205) discloses etching thin chromium layers of a mask by the EBIE-method in the presence of $XeF_2$.

The publication of Russel et al. teaches to use $XeF_2$ and high electron energies of 5-20 keV, as well as comparatively high electron currents of 1.6 nA to obtain high yields of removal. However, it is reported that the high electron energy causes a loss of spatial resolution when etching a chromium layer. Furthermore, the method disclosed by Russel et al. does not allow etching of any chromium layer. For example, a chromium layer sputtered onto a silicon substrate could not be etched. The explanation for this failure was that metal contaminations in the deposited chromium layer impaired the etching process.

In the discussion of the measurement results, Russel et al. teach that the surface chemical process, which determines the etching rate, is the desorption of $CrO_2F_2$ or, as an alternative reaction product, $CrOF_2$ from the surface of the chromium layer. Oxygen, in contrast, which is to some extent always present in the residual gas of the vacuum chamber, is not considered by Russel et al. to be a relevant factor for the etching rate to be obtained.

Thus, there is a need for repairing masks and editing circuits sufficient to only remove metal/metal oxide/insulating layers. Additionally, selective deposition of a metal layer is also desired. Upon satisfying these needs and desires it will be possible to simply and reliably repair or modify photolithography masks and other metal/metal oxides/insulating layer systems.

SUMMARY OF THE INVENTION

According to a first aspect of the present invention a method is provided for etching a metal layer, in particular a chromium layer, inside a vacuum chamber which may comprise the method steps of: introducing a halogen compound into the vacuum chamber, directing an electron beam onto the area of the chromium layer to be etched, and introducing an oxygen including compound into the vacuum chamber.

The additional provision of an oxygen including compound may produce a high etching yield for the metal layer even at low electron energies and may avoid deterioration of the resolution described in the prior art. Furthermore, the method may also allow and/or enable etching of sputtered or vapor deposited chromium layers. In some embodiments, the etching reaction may be initialized by a focused electron beam, and there may be no other energy transmitting mechanisms such as heating the sample or laser radiation present in the etching reaction and/or initialization of the etching reaction.

A dosage of the halogen compound and the oxygen including compound may depend on a geometry of the vacuum chamber, a pumping power of vacuum pumps used as well as a geometric arrangement of gas nozzles. In general, the gas flow of the halogen compounds may be adjusted such that the partial pressure measured inside the chamber is in the range of $10^{-5}$ to $10^{-3}$ millibars (mbar). The arrangement of the gas nozzles close to the substrate may correspond to a local gas pressure at the location of repair of approximately $10^{-4}$ to $10^{-1}$ mbar. The ratio of local partial pressures defined in this manner between the halogen and the oxygen including compound may be in the range of 1000:1 to 1:2. It may be preferred between 100:1 to 1:1 and more preferred at 10:1.

In this context, it is to be noted that even at a low dosage of the oxygen including compound, a local partial pressure at the location of repair may still be above the corresponding typical base pressure in the chamber which may be present if no oxygen including compound was added. Concerning the sequence of dosage the halogen compound and the oxygen including compound may be introduced into the vacuum chamber either sequentially or essentially simultaneously.

$O_2$, $H_2O$, or $H_2O_2$ or mixtures thereof are may be preferably used as oxygen including compounds. The halogen compound may preferably comprise fluorine.

As mentioned above, the method according to one embodiment may allow use of lower electron beam energies and lower currents. Preferably, the electron beam may comprise a current of <400 pA and more preferably of <100 pA. Preferably, the electron beam comprises an energy of <5 keV and more preferably close to or essentially 1 keV. The electron beam may preferably comprise a current density of more than 1 A/cm² and more preferably >200 A/cm². Even at an electron energy of 1 keV, this may be achieved by using, for example, the LEO Gemini lens of the company LEO Elektronenmikroskopie, GmbH and by using a cold or thermal field emission electron source. Further information on this may be found in: H. Jaksch "Field emission SEM for true surface imaging and analysis", Materials World, October (1996), and P. Gnauck "A new high resolution field emission SEM with variable pressure capabilities" Proc. EUREM 2000 BRNO, CZ.

In some embodiments, a method for highly resolved removing a layer out of a metal and/or a metal oxide arranged on an insulator or substrate with poor thermal conductivity may comprise: arranging the layer inside a vacuum chamber, bombarding the layer with a focused electron beam of an energy of 3-30 keV, wherein the electron beam may be guided such that the energy transfer per time and area leads to a localized heating of the layer above its melting and/or vaporization point and wherein the removal of the layer may be performed without adding reaction gases in the vacuum chamber.

Focused electrons in the indicated energy range may allow removal, e.g., vaporization, of the mentioned layers including metal layers such as chromium, which has a good thermal conductivity. Since the additional reaction gases, which were used until now, are no longer necessary, various embodiments of the present invention may be performed more easily and at lower costs than in the past.

In various embodiments, the electron beam may be pulsed, wherein the dose of the pulsed electron beam may be locally varied to modify the amount of the removed material. As a result, the material removal may be adapted to any arbitrary shape of a defect such as, for example, a photolithography mask.

The electron beam may comprise a current of 0.1 nA to 1 µA and preferably an energy between 5 keV and 25 keV, more preferably close to or essentially 10 keV.

The electron beam may comprise a diameter of 0.1 µm to 0.5 µm and thereby may allow and/or enable processing of common structures of a photolithography mask or a semiconductor device.

In some embodiments, a method for the highly resolved manufacturing of a metal layer and/or a metal oxide layer and/or an insulator may comprise: arranging a substrate inside a vacuum chamber, leading at least one anorganic, organic or metal organic precursor into the vacuum chamber, depositing the precursor onto the substrate and selectively irradiating the substrate with an electron beam for manufacturing a conducting metal layer from the deposited precursor, and/or selectively irradiating the substrate with an electron beam for manufacturing a non-conducting insulating layer from the deposited anorganic or organic precursor.

In one example, the metal organic precursor may comprise atoms of a metal with a low electric resistance to create conducting interconnections of a high quality. In a second example, the anorganic or organic precursor may comprise groups of molecules of insulators to create insulators of a high quality.

The selective irradiation of the substrate may cause a localized heating to a temperature between 50° C. and 100° C., preferably between 70° C. and 80° C., leading to a desorption of the organic compounds of the defraction products of the precursor and an unintended reaction products from the substrate.

The method indicated here no longer requires the expensive heating table and, by far more important, thereby excludes the resulting drifts and instabilities of the process and the apparatus.

Further, the method may be advantageously used to control and to accelerate (temperature range from room temperature up to 150° C.) a chemical reaction of metal etching or the deposition of insulators of high quality by a localized temperature increase. Alternatively, a delay may be possible by significantly reducing the condensation of the precursor at temperatures close to or above 350° C.

In some embodiments, a method for processing a photolithographic mask and/or the conducting strips of a semiconductor device may comprise steps of the highly resolved removal of a metal and/or metal oxide and/or an insulating layer with any of the above indicated methods, steps of depositing a new metal layer with the above explained method and optional or alternative step of additional provision of a new insulating layer with the method explained above.

A combination of the methods described herein for a highly resolved removal of undesired layers with the highly resolved deposition of a conducting metal layer and/or an insulating layer according to embodiments of the invention may remove many different defects of a photolithography mask. With respect to a semiconductor device a circuit editing may be possible, i.e. the selective modification of the microscopically small electric structures by later selectively separating or interconnecting conducting strips of the device.

BRIEF DESCRIPTION OF THE DRAWINGS

A better understanding of the present invention can be obtained when the following detailed description of the preferred embodiment is considered in conjunction with the following drawings, in which.

Figure 1:
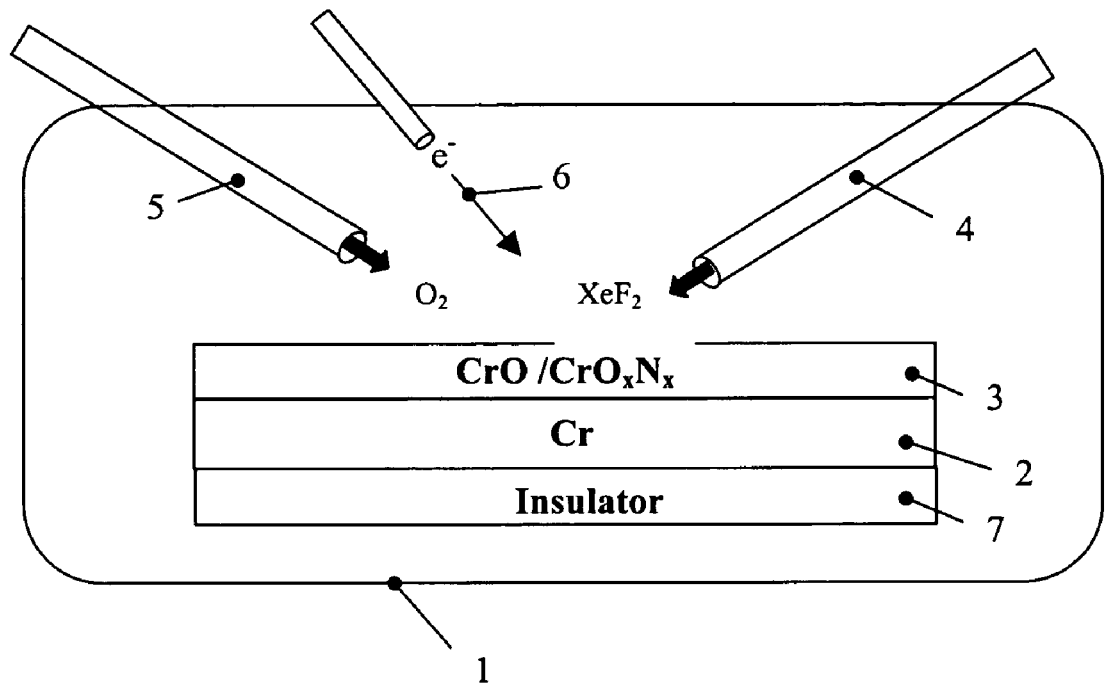
FIG. 1 shows a schematic presentation for performing a method according to a first aspect of the invention wherein a sample arranged within a vacuum chamber may be processed by a focussed electron beam and wherein different reagents for reacting with the material arranged on the sample may be supplied with at least two gas supply nozzles.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

In the following, preferred embodiments of a method according to the invention are explained. However, it is to be understood that parameters indicated in the following are only preferred values so that deviations from those values may also lead to the success according to the invention.

Firstly, the method according to a first aspect of the present invention may be described on the basis of etching a chromium layer. However, the method may also advantageously be used for all other metals which may for example be used as strip conductors in semiconductor devices such as copper or aluminum, if their chemical properties allow the formation of metal oxygen halogen compounds.

As schematically shown in FIG. 1, a chromium layer 2 to be etched may be arranged within a vacuum chamber 1, for example an electron beam apparatus adapted for performing the method, such as an electron microscope. The vacuum should be sufficient so that the free mean path length of the electron reaches the sample. High vacuum conditions ($<10^{-6}$ mbar), however, may not be necessary. The chromium layer 2 may be a mask for photolithography but also any other chromium layer, for example, of a semiconductor device.

The chromium layer 2 may be typically covered with a naturally formed oxide or, in case of a photo mask, with an approximately 40 nm thick CrO layer 3, which may in addition to oxygen also comprise nitrogen. Masks for photolithography typically comprise a layer of chromium oxynitride as an anti-reflection coating. The chromium layer 2 may typically comprise small amounts of contaminations of carbon and possibly metals in low concentrations. The exact composition may be determined by known methods for surface analysis such as Auger electron spectroscopy (AES) or photoelectron spectroscopy (XPS).

Using the EBIE-method known from the prior art may allow etching of the topmost CrO or $CrO_xN_x$-layer 3 in the presence of $XeF_2$ with a low energy electron beam of 1 keV. However, the Cr layer 2 arranged therebelow may only be etched with higher electron energy. It may be assumed that the essential etching process for the chromium in the prior art may be a thermal evaporation due to the strong localized heating of the high energetic electron beam 6. However, this is not taught in the prior art of Russel et al.

In a preferred embodiment, as schematically shown in FIG. 1, an oxygen including compound may therefore be in addition to the etching gas $XeF_2$ introduced into the chamber 1. Apart from $XeF_2$ other halogen compounds may also be considered, for example, $Cl_2$, $Br_2$ and $I_2$. Further, other noble gases may be used in addition to or instead of xenon. The oxygen including compound is preferably molecular oxygen ($O_2$), water ($H_2O$) or hydrogen peroxide ($H_2O_2$). Other oxygen releasing compounds are also conceivable and/or may be considered.

Both, the $XeF_2$ and the oxygen including compound may be supplied by suitable dosing valves and corresponding nozzles 4 or 5 onto an area of the chromium layer to be etched. Particularly preferred may be the etching process, if the oxygen including compound is dosed such that the oxygen and the halogen are present in a ratio of 1:100 to 1:10. This may easily be adjusted by using the dosing valve and the pressure adjustment in front of the nozzles, which determine the flow, and their geometry, wherein a mask spectrometer for analyzing the residual gas may additionally be used. Even lower doses of the oxygen including compound in the range of <1:100 may lead to a further improvement of the etching rate.

The dosage of the oxygen including compound may either be simultaneous to the actual etching process or the $CrO_xN_x$ layer may be first etched, the Cr layer may be subsequently oxidized at its surface by the oxygen including compound in the vacuum chamber 1 which is followed by further etching etc. In any case, the addition of the oxygen including compound may assure that sufficient oxygen is offered for the formation of the reaction products $CrO_2F_2$ and $CrOF_2$ which desorb from the surface. This method may allow etching of, for example, a chromium layer of a photolithographic mask down to a substrate.

To achieve the etching, it may be necessary to supply both etching gases with partial pressures measured in the chamber, which may be at least 10 times or up to 150 times above the base pressure of the chamber of typically $10^{-6}$ mbar. It may be noted that the gas supply may provide at the location of the processing of the masks a local halogen gas pressure in the range of $10^{-5}$ mbar to $10^{-1}$ mbar and a local oxygen gas pressure in the range of $10^{-7}$ mbar to $10^{-1}$ mbar. This may be achieved by a particular throttling of the chamber gas or a low distance of the nozzles from the object.

In addition to balancing the chemical substances participating in the reaction, the provision of the media from the gas supplying nozzle may be taken into account by bombarding the layer to be etched with electrons in several repeated steps. However, refresh times may be maintained before the beam returns to the previously processed spot to assure a complete coverage of the surface with new molecules from the gas supply, which may be necessary for the reaction. The beams may be either turned off or other spots may be processed in between before the return to the initially processed spot. The time length for the beam to remain at one spot (the so-called "pixel dwell time") may be below $10^{-3}$ seconds and may preferably be below $10^{-5}$ seconds.

In contrast to methods previously known until now, the addition of oxygen may allow etching of chromium layers already at low electron energies. Values are below 5 keV may be preferred, preferably at or around approximately 1 keV. Also the currents may be reduced so that typical values may be below 400 pA, particularly preferred values may be below 100 pA. A localized heating of the chromium layer 2 and the corresponding loss of spatial resolution during etching may not be feared at these values. Also the condensation of the reaction molecules on the surface may remain high, which may not be the case at an elevated temperature.

The area to be etched may be determined by the electron beam, which may be scanned over the chromium layer by known methods (for example the beam control of a scanning electron microscope). Thermal effects may include only a secondary influence, if at all. As a result, the method, according to some embodiments, may allow etching of chromium layers with a high rate and high resolution to modify the structure of a photolithographic mask.

The method may also be used with very low energy electrons, for example, from a scanning tunneling microscope or another low energy electron source, since only energies >2 eV may be necessary for starting the chemical reaction of the oxidation or fluoration of the oxide.

Figure 2:
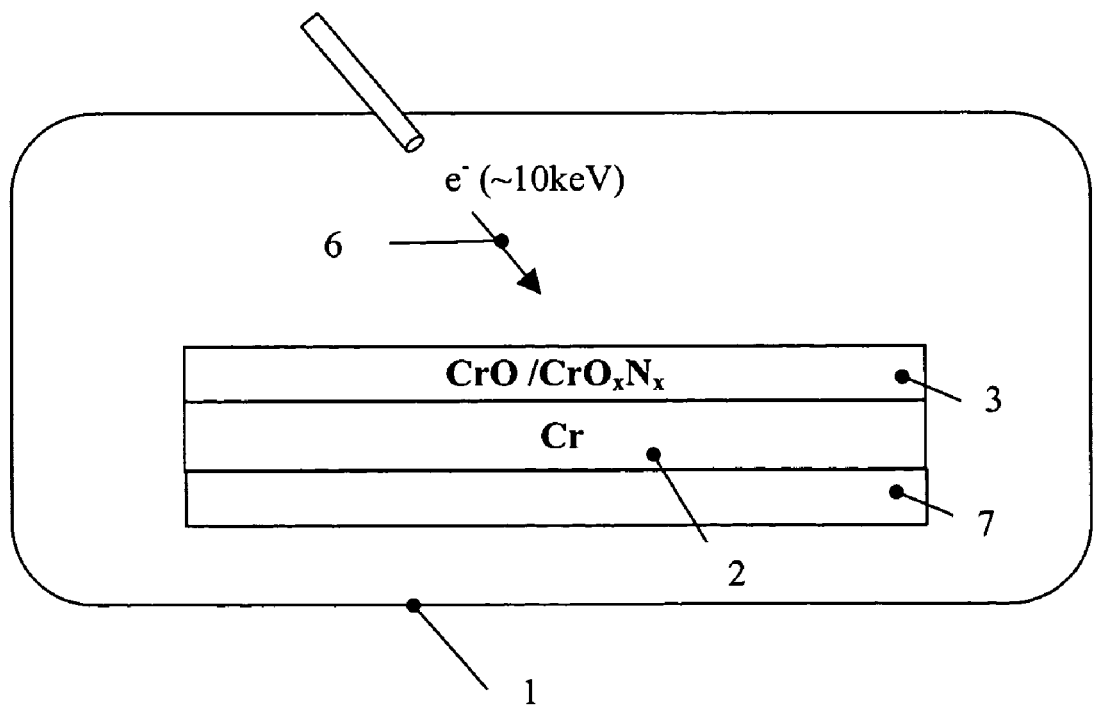
FIG. 2 shows a schematic presentation for performing a method according to a second aspect of the invention, wherein a sample arranged within a vacuum chamber may be processed exclusively by bombardment with a focused electron beam.

FIG. 2 shows schematically the performance of a further method for the selective removal of material. In this case the surface to be processed may be bombarded with a focused electron beam at an energy of preferably approximately 10 keV without adding any reaction gases. The currents of the electron beam may be preferably between 0.1 nA and 1 µA. This may allow selectively creating holes in a chromium oxide-chromium oxynitride layer and the chromium layer of a photolithography mask arranged therebelow. This may be explained by the thermal evaporation of the material by the high energetic electron beam. The diameter of the beam may be preferably between 0.1 µm and 0.5 µm.

The obtained material removal may be determined by the current, the energy of the electron beam, its pulse length, and by the thermal conductivity of the layer to be processed. An appropriate distribution of the dose rate may be provided by the electron beam which may allow adapting the yield to the geometry of a defect of a mask or a semiconductor device to be processed. The method may also be advantageously used for modifying circuits, i.e. circuit editing, wherein metal conductive strips may be separated or may be reconnected inside the depth of a device. The electron beam may enter preferably the depth of the device through the same opening which was at first opened by evaporation or chemical etching with support of the electron beam. Finally, this method may also be used for repairing arbitrary metal layers on substrates with poor thermal conductivity such as a next generation lithography NGL mask for deep UV, extreme UV (EUV), etc., which may have the highest requirement to the spatial resolution.

Figure 3:
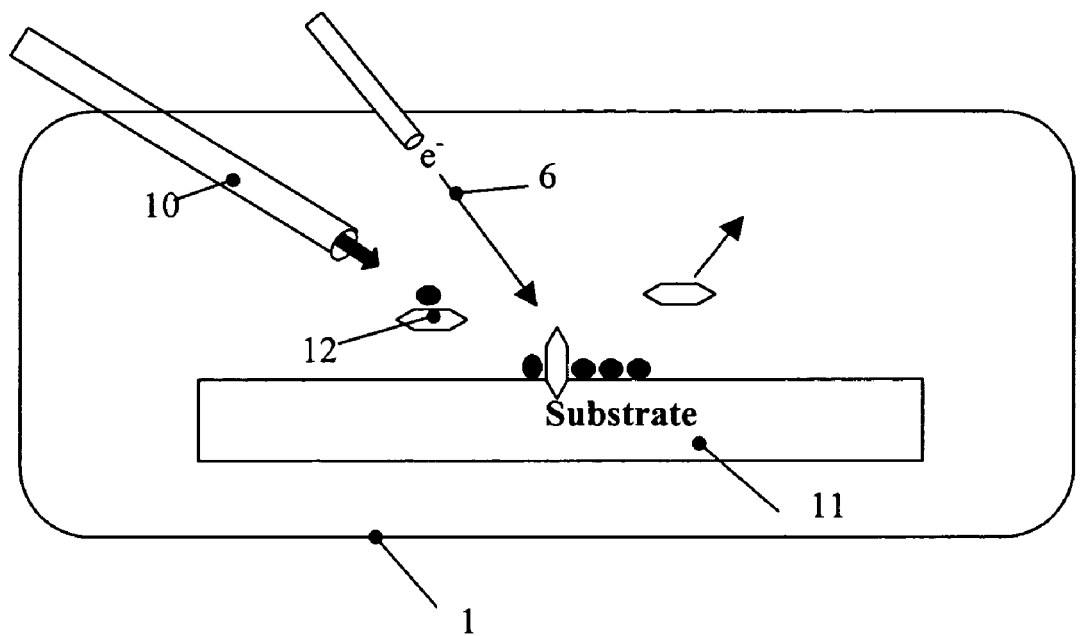
FIG. 3 shows a schematic presentation for performing the method for a highly resolved deposition of a metal layer and/or an insulating layer according to a further aspect of the invention.

FIG. 3 illustrates a further aspect of the present invention. Using this method it may be possible to deposit metal layers with a high spatial resolution. To this end, a precursor gas 12 may first be introduced into the vacuum chamber via a nozzle 10. Suitable precursor gases may be, in particular, metallo-organic compounds, for example, cyclopentadienyl platinum dimethyl, which may be deposited onto the substrate from the gas phase. If this condensate is subsequently selectively exposed to an electron beam, the organic parts desorb and the remaining metal atoms may form a conducting metal layer which may be used for repairing defects of a mask or a semiconductor device.

The electron beam, which may have in this method preferably an energy of 1 keV-40 keV and a current in the region of 1 pA to 100 nA may not heat the sample. This may apply up to currents below 1 nA. The improvement to the prior art may be achieved by heating the substrate locally resolved to temperatures between 50° C. and 100° C., preferably approx. 80° C. by a suitable selection of the current and the electron energy as well as the focus, which may cause a local desorption of the organic components of the precursor. This may allow production of purer substances with less contamination, which may be relevant for the manufacture of well-conducting materials but also for highly insulating materials which may, for example, be deposited from TEOS (tetraethyl ortho siloxane) or other silanes by EBID (electron beam induced deposition). The localized heating of the substrate and the thermal control of the reaction leads to purer oxides. Both may be necessary for circuit editing. The exact temperature, which may also be outside of the indicated range, depends on the organic compounds of the precursor substances 12 which may be respectively to be dissolved and on the strength of their bond to the substrate. This method may not follow the approach to remove, with a high current, reaction products out of the substrate material and the absorbed precursor from the surface which may have been caused in a reaction by means of a heat supply from a broadly distributed electron beam, and to obtain their vaporization since otherwise they may remain on the surface, cf. the evaporation of chromyle chloride above 250° C.

This method may not require a complex mechanically unstable arrangement for a heated table to heat the overall substrate and may allow, for example, with the help of a computer based prediction of the heating an exact control of the reaction (cf. the program "Temptation" of the company Soft Services, Castro Valley, Calif., USA).

Figure 4:
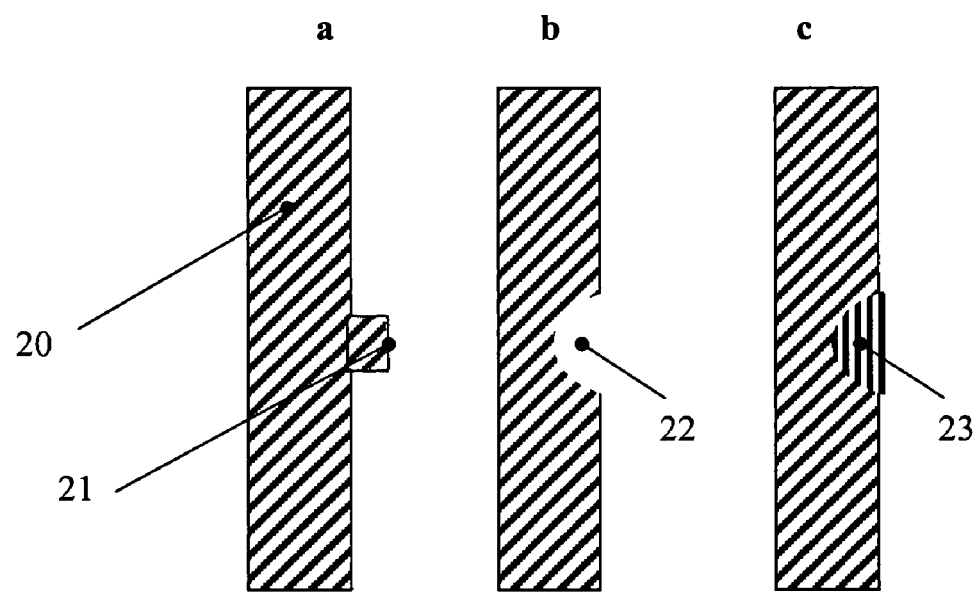
FIGS. 4A-4C show schematically a sequence of steps when repairing a metal layer, for example of a photolithographic mask, wherein layer material may be removed and subsequently new metal and/or insulator material is selectively deposited in the defect region.

If the above explained methods are combined, defects 21 of a mask or a strip-conductor 20 of a semiconductor element as schematically shown in FIG. 4A may be easily repaired by means of a focussed electron beam. To this end, material may first be removed from the strip conductor 20 by selective etching using the above-described method with a halogen compound and an oxygen including compound at low electron currents or by a bombardment with high energetic electrons of a high current (high current process) in order to bring the defect 21 into a defined shape 22 (see FIG. 4B). In a further step (see FIG. 4C), the above-explained method may subsequently used to selectively deposit at a comparatively low electron current (preferred values may be 1 pA to 500 pA) opaque or transparent or electrically conducting material 23 in the region of the etched repair point 22, so that the desired shape of the strip conductor may be restored.

Also the reversed sequence for processing a defect may be conceivable wherein material may first be deposited using the explained high resolution deposition technique in the area of the defect and wherein subsequently any excessive material may be etched in the described manner or vaporized by high energetic electron bombardment. In any case, the overall process may be performed in situ in a single vacuum chamber. Only the mentioned process gases may need to be introduced and the parameters of the electron beam may need to be adjusted in the indicated manner.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed:

1. A method for etching a metal and/or a metal oxide layer in a vacuum chamber, comprising:

introducing a fluorine containing halogen compound and an oxygen containing compound into the vacuum chamber; and directing an electron beam having an energy of less than 5 keV onto the area of the metal layer to be etched in the presence of the fluorine containing halogen and the oxygen containing compound.

2. The method of claim 1, wherein the fluorine containing halogen compound and the oxygen including compound are dosed such that the ratio of the local partial pressures of oxygen to halogen is between 1:1000 and 2:1.

3. The method of claim 2, wherein the fluorine containing halogen compound and the oxygen including compound are dosed such that the ratio of the local partial pressures of oxygen to halogen is between 1:100 and 1:1.

4. The method of claim 3, wherein the fluorine containing halogen compound and the oxygen including compound are dosed such that the ratio of the local partial pressures of oxygen to halogen is essentially 1:10.

5. The method of claim 1, wherein $O_2$, $H_2O$, or $H_2O_2$ or mixtures thereof are used as oxygen including compound.

6. The method of claim 1, wherein the fluorine containing halogen compound comprises xenon or another noble gas.

7. The method of claim 1, wherein the fluorine containing halogen compound comprises one or more of $XeF$, $XeF_2$, $XeF_4$.

8. The method of claim 1, wherein a current of the electron beam is less than 400 pA.

9. The method of claim 8, wherein the current of the electron beam is less than 100 pA.

10. The method of claim 1, wherein the electron beam has an energy of between 2 eV and 2 keV.

11. The method of claim 10, wherein a refresh time of the electron beam is greater than or equal to 1 millisecond (msec).

12. The method of claim 10, wherein a dwell time of the electron beam is between $10^{-8}$ and $10^{-3}$ seconds.

13. The method of claim 12, wherein the dwell time of the electron beam is between $10^{-7}$ and $10^{-5}$ seconds.

14. A method for etching a metal and/or a metal oxide layer in a vacuum chamber, comprising:
  introducing a fluorine containing compound and an oxygen containing compound into the vacuum chamber; and
  directing an electron beam onto the area of the metal layer to be etched in the presence of the fluorine containing halogen and the oxygen containing compound;
  wherein said introducing the oxygen including compound provides a formation of reaction products that desorb from the surface of the area of the metal layer.

* * * * *